United States Patent
Seth et al.

(10) Patent No.: US 11,171,603 B2
(45) Date of Patent: Nov. 9, 2021

(54) VOLTAGE TOLERANT OSCILLATOR WITH ENHANCED RF IMMUNITY PERFORMANCE

(71) Applicant: TEXAS INSTRUMENTS INCORPORATED, Dallas, TX (US)

(72) Inventors: Sumantra Seth, Bengaluru (IN); Isha Khandelwal, Bengaluru (IN); Rama Santosh Neelim Kumar Kattamuri, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/074,688

(22) Filed: Oct. 20, 2020

(65) Prior Publication Data

US 2021/0194429 A1    Jun. 24, 2021

(30) Foreign Application Priority Data

Dec. 19, 2019   (IN) .............................. 201941052911

(51) Int. Cl.
*H03B 5/36*   (2006.01)
*H03H 7/06*   (2006.01)

(52) U.S. Cl.
CPC ............ *H03B 5/362* (2013.01); *H03B 5/364* (2013.01); *H03H 7/06* (2013.01); *H03B 2200/0012* (2013.01)

(58) Field of Classification Search
CPC . H03B 5/30; H03B 5/32; H03B 5/326; H03B 5/36; H03B 5/362; H03B 5/364; H03B 5/366; H03B 5/368; H03B 2200/0012

USPC ........... 331/116 FE, 116 M, 116 R, 154, 158
See application file for complete search history.

(56) References Cited

U.S. PATENT DOCUMENTS

| | | | | |
|---|---|---|---|---|
| 3,828,278 A * | 8/1974 | Rees | ..................... | H03K 3/3545 331/116 FE |
| 4,321,562 A * | 3/1982 | Igarashi | ................. | H03B 5/364 331/116 FE |
| 6,133,801 A * | 10/2000 | Tanaka | ..................... | H03B 5/32 331/158 |
| 6,157,265 A * | 12/2000 | Hanjani | .................... | G06F 1/08 327/298 |
| 6,559,730 B1 * | 5/2003 | Marvin | .................. | H03B 5/366 331/116 FE |
| 7,639,094 B1 * | 12/2009 | Stevenson | ................ | H03B 5/36 331/108 C |
| 2007/0268082 A1 * | 11/2007 | Sugio | ................... | H03K 3/0307 331/116 R |
| 2009/0009229 A1 * | 1/2009 | Ker | .......................... | H03B 5/36 327/333 |

(Continued)

*Primary Examiner* — Levi Gannon
(74) *Attorney, Agent, or Firm* — John R. Pessetto; Charles A. Brill; Frank D. Cimino

(57) ABSTRACT

An integrated circuit includes an inverter, first and second capacitors, a resistor, and a transistor. The inverter has an input and an output. The first capacitor is coupled to a ground. The transistor has a first transistor terminal, a second transistor terminal, and a control input. The first transistor terminal is coupled to the first capacitor and the second transistor terminal is coupled to the input of the inverter. The second capacitor is coupled between the output of the inverter and the ground. The resistor is coupled between the output of the inverter and the first transistor terminal.

7 Claims, 3 Drawing Sheets

(56) References Cited

U.S. PATENT DOCUMENTS

2011/0291767 A1* 12/2011 Ishikawa .................. H03B 5/06
  331/154
2016/0373060 A1* 12/2016 Liao ....................... H03B 5/364
2018/0159542 A1*  6/2018 Spijker ................... H03B 5/32

* cited by examiner

VOLTAGE TOLERANT OSCILLATOR WITH ENHANCED RF IMMUNITY PERFORMANCE

CROSS REFERENCE TO RELATED APPLICATION

This application claims priority to India Provisional Application 201941052911, filed Dec. 19, 2019, titled "A High Voltage Tolerant Crystal Oscillator Circuit with Enhanced RF Immunity Performance," which is hereby incorporated by reference in its entirety.

BACKGROUND

Many types of digital circuits operate using a dock signal. Accordingly, clock generation circuits are included to support the operation of the digital circuit. One type of dock generation circuit is the Pierce gate oscillator circuit.

SUMMARY

An integrated circuit includes an inverter, first and second capacitors, a resistor, and a transistor. The inverter has an input and an output. The first capacitor is coupled to a ground. The transistor has a first transistor terminal, a second transistor terminal, and a control input. The first transistor terminal is coupled to the first capacitor and the second transistor terminal is coupled to the input of the inverter. The second capacitor is coupled between the output of the inverter and the ground. The resistor is coupled between the output of the inverter and the first transistor terminal.

BRIEF DESCRIPTION OF THE DRAWINGS

For a detailed description of various examples, reference will now be made to the accompanying drawings in which.

DETAILED DESCRIPTION

A Pierce gate oscillator is a type of oscillator circuit often used in integrated circuits (ICs). A Pierce gate oscillator includes, among components, a complementary metal-oxide-semiconductor (CMOS) inverter. A CMOS inverter may include a p-type metal metal-oxide-semiconductor field effect transistor (PMOS) and an n-type metal-oxide-semiconductor field effect transistor (NMOS). A transistor is designed to certain specifications. For example, a transistor is rated for a maximum allowable voltage between any two of its nodes (gate, source, drain). For increased switching speed reasons, transistors may be fabricated with a relatively thin layer of the gate oxide. For example, a thin gate oxide transistor may be rated for a maximum of 1.8V, that is, the voltage between any of its terminals may not exceed 1.8V. A voltage greater than the rating (e.g., 1.8V) may cause the gate oxide to breakdown thereby causing the transistor to malfunction.

Many integrated circuits (ICs) include an oscillator circuit to generate an internal clock signal (referred to also as "clock") to operate digital circuitry implemented on the IC. For some applications, the oscillator circuit on the IC should also be capable of receiving an externally supplied clock signal. That is, the oscillator circuit should be capable of an external oscillator mode. In one example, the oscillator circuit on an ethernet interface chip for automotive use should be capable of external oscillator mode. However, the externally generated clock signal may be in a larger voltage domain than the on-chip oscillator circuit. For example, the on-chip oscillator circuit may operate from a 1.8V supply voltage but the externally supplied clock signal may be a 3.3V clock (i.e., toggles between 0V and 3.3V). A 3.3V clock may damage the transistors within the inverter of the on-chip oscillator circuit. The examples described herein avoid damage to the inverter's transistors when an externally supplied clock having a peak voltage in excess of the voltage rating of the transistors is provided as an input to the on-chip oscillator.

Figure 1:
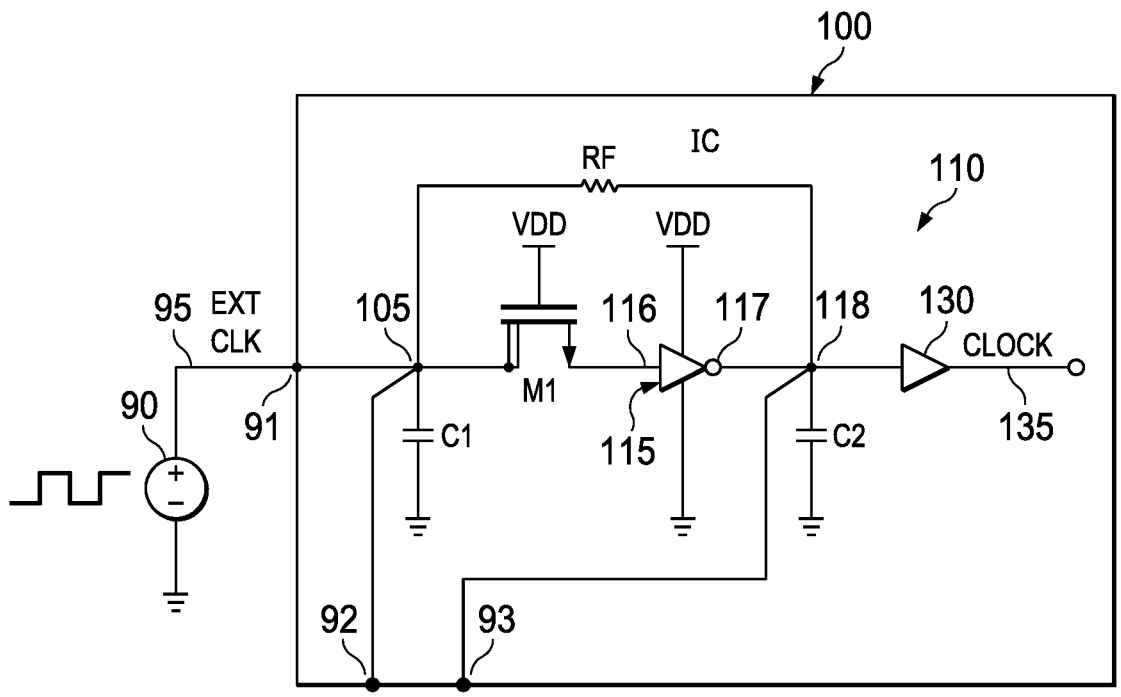
FIG. 1 illustrates an example of an oscillator circuit.

FIG. 1 shows an example of an IC 100 on which an oscillator circuit 110 has been fabricated. The oscillator circuit 110 includes an inverter 115, capacitors C1 and C2, a feedback resistor RF, a buffer 130, and a transistor M1. The inverter 115 has an input 116 and an output 117. The feedback resistor RF is connected between the inverter's output 117 and capacitor C1. The transistor M1 is connected between capacitor C1 (at node 105) and the input 116 of the inverter 115. One terminal of capacitor C1 is connected to the feedback resistor RF (node 105) and the other terminal of capacitor C1 is connected to ground. One terminal of capacitor C2 is connected to the output 117 of inverter 115 and the other terminal of the capacitor C2 is connected to ground. The output 117 of inverter 115 is also connected to the input of the buffer 130 at node 118. The output of the buffer 130 provides the internal clock (CLOCK) 135 for use in controlling the timing of other digital circuits (not shown in FIG. 1) on the IC 100.

The IC 100 includes an input/output (I/O) pin 91 to which an external clock generator 90 can be connected (and is shown as being connected in the configuration of FIG. 1). With an external clock generator 90 connected to I/O pin 91, an external clock signal (EXT CLK) 95 is supplied through transistor M1 to the input 116 of the inverter. CLOCK 135 is thus generated based on EXT CLK 95. In another configuration, such as that shown in FIG. 3 (discussed below), no external clock generator 90 is connected to the I/O pin, and instead a crystal is connected to the clock circuit 110 to generate CLOCK 135. I/O pins 92 and 93 are included for connection to a crystal.

In the example of FIG. 1, transistor M1 comprises a drain extended n-type metal-oxide-semiconductor (DENMOS) transistor and, as such, includes a gate, a drain, a source, and a body. The gate is biased at the same supply voltage (VDD) as is supplied to inverter 115. The source of transistor M1 is connected to the input 116 of the inverter, and the drain is connected to capacitor C1 and I/O pin 91 at node 105. The source of M1 will have a voltage equal to the threshold voltage of M1 below its gate voltage (Vg−Vth, where Vg is the gate voltage and Vth is the threshold voltage). In one example, VDD is 1.8V and thus M1's source voltage is 1.8V−Vth. As such, the input voltage to inverter 115 is less than 1.8V and thus at a low enough level so as not to damage the transistors of inverter 115, which may be rated for a voltage of 1.8V. Moreover, while the voltage on the drain of M1 may be higher than the voltage rating of the transistors of inverter 115, the voltage on the source of M1 is less than VDD and thus less than the voltage rating of the inverter's transistors.

Figure 2:
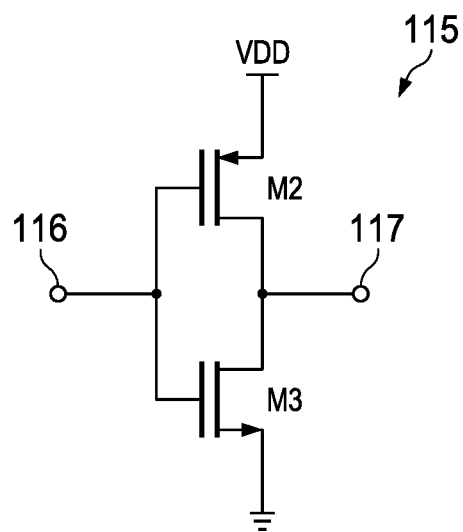
FIG. 2 shows an example implementation of an inverter used in the oscillator circuit.

FIG. 2 illustrates an example implementation for inverter 115. In this example, the inverter 115 includes a PMOS transistor M2 and an NMOS transistor M3. The source of M2 is connected to VDD and the source of M3 is connected to ground. The gates of M2 and M3 are connected together and provided the input 116 of the inverter. The drains of M2 and M3 are connected together and provided the output 117 of the inverter. With the voltage on the input 116 being a threshold voltage of M1 below VDD, the voltage on the gate of M3 is not large enough to damage M3.

Referring back to FIG. 1, transistor M1 is within the feedback loop implemented by feedback resistor RF. That is the, feedback loop through RF connects between the output 117 of inverter 115 and node 105, and transistor M1 is between node 105 and the inverter. Another possible location for transistor M1 is between node 105 (the feedback connection point for feedback resistor RF) and the I/O pin 91. At this latter location, transistor M1 introduces non-linearities into the circuit's operation. The feedback resistor RF helps to bias the inverter 115 so that the gain of the oscillator circuit is at its maximum value. With the gain of the oscillator circuit at its maximum gain value, the common mode voltage of on the input 116 of the inverter, and thus on the output of the inverter, will be VDD/2. For an example VDD of 1.8V, the common mode voltage of the input of the inverter will be 0.9V. However, if transistor M1 was positioned between I/O pin 91 and node 105, the common mode voltage on the input 116 of the inverter may not be VDD/2 due to non-linearities caused by the operation of transistor M1. For example, the voltage on the source of M1 will be clipped at VDD-Vth when EXT CLK 95 exceeds VDD−Vth. The common mode voltage of the input 116 of the inverter will be influenced by the feedback resistor RF and transistor M1. If the common mode voltage on the inverter's input deviates from VDD/2, the common mode voltage on the inverter's output 117 will also deviate from VDD/2 and the common mode voltage on the input to buffer 130 will not match the threshold voltage of the buffer (the buffer's threshold also may be VDD/2). As a result of this mismatch, the duty cycle of CLOCK 135 may deviate significantly from 50%. The duty cycle, however, should be within a narrow range of 50% (e.g., between 48% and 52%).

By locating transistor M1 as shown in FIG. 1 (between node 105 and the input 116 of inverter 115), the common mode voltage on the inverter's input 116 is set mainly (or only) by the feedback resistor RF. As a result, very little, if any, mismatch will be present between the common mode voltage on the input to buffer 130 and the buffer's threshold voltage. That is, the common mode voltage of the signal on the input of the inverter will be equal to, or nearly equal to, VDD/2 despite the presence of transistor M1.

Figure 3:
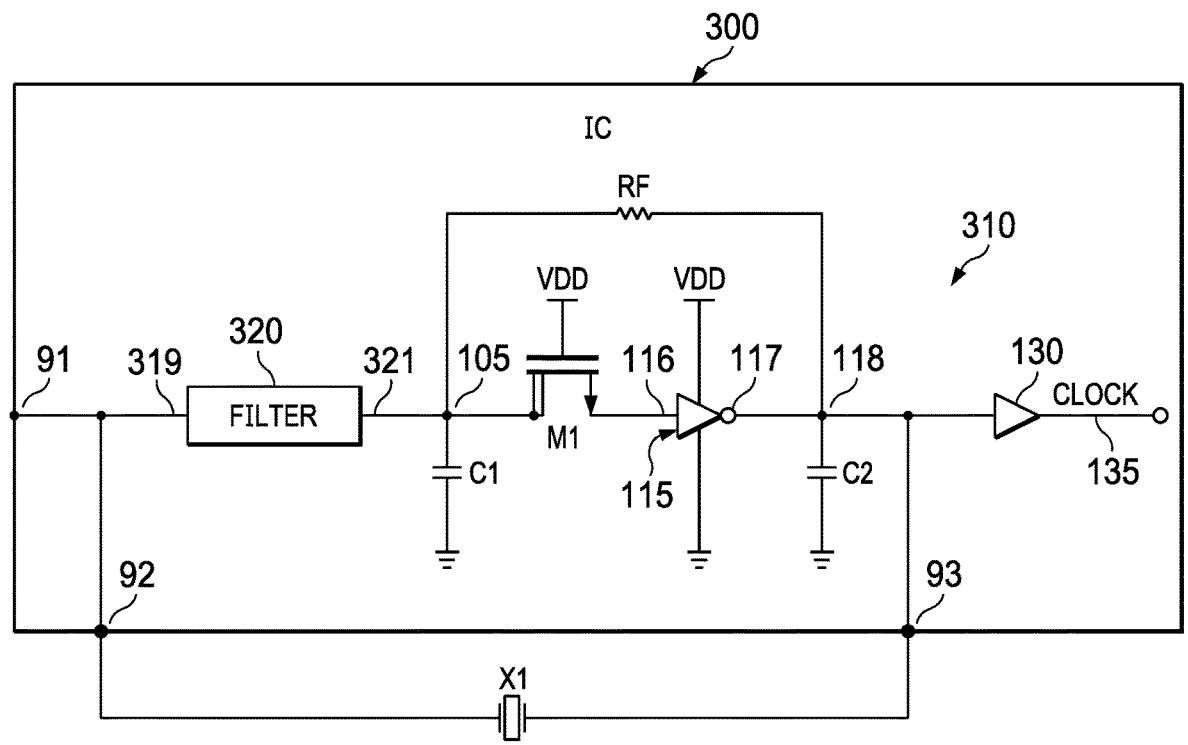
FIG. 3 illustrates another example of an oscillator circuit which includes a filter.

FIG. 3 shows an example of an IC 300 that includes an oscillator circuit 300. In this example, a crystal X1 connected to the oscillator circuit 310 via I/O pins 92 and 93, instead of an external clock generator 90 (as was the case for the example of FIG. 1). The configuration of the oscillator circuit 310 is largely the same as oscillator circuit 110 of FIG. 1. Transistor M1 is coupled between node 105 and the input 116 of inverter 115. The feedback resistor RF is connected between nodes 118 and 105. Capacitor C1 is coupled between node 105 and ground, and capacitor C2 is coupled between node 118 and ground. The output 117 of inverter 115 is coupled to the input of buffer 130. The gate of transistor M1 is biased at VDD, the same supply voltage as is provided to inverter 115.

A difference between oscillator circuit 310 and oscillator circuit 110 is that oscillator circuit 310 includes a filter 320. Filter 320 includes an input 319 and an output 321. The input 319 is coupled to the I/O pin 91 and I/O pin 92, and thus to crystal X1. The output 321 of filter 320 is coupled to node 105, and thus to capacitor C1, the drain of transistor M1, and to feedback resistor RF. In some applications, noise may be present at a particular frequency or band of frequencies. For example, electromagnetic interference (EMI) may occur within a band of frequencies centered at approximately 1-3 GHz. The frequency of CLOCK 135, however, may be 25 MHz. Filter 320 is included in this example to attenuate any noise above 25 MHz such as in the 1-3 GHz range.

Figure 4:
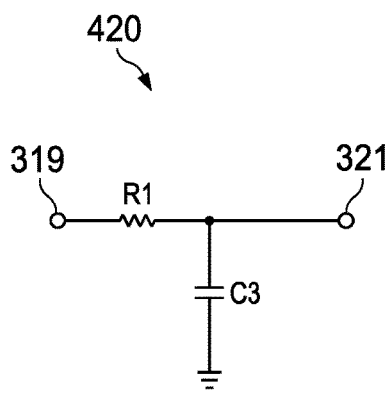
FIG. 4 shows an example of the implementation of the filter of FIG. 3 as a low-pass filter.

FIG. 4 shows an example of a filter 420, which can be used to implement filter 320 of FIG. 3. In this example, filter 420 is a low-pass filter comprising resistor R1 and capacitor C3. One terminal of resistor R1 provides the filter's input 319 and the other terminal of resistor R1 provides the filter's output 321. Capacitor C3 is coupled between the output 321 and ground. The resistance of R1 and capacitance of capacitor C3 are selected so that the 3 dB roll-off point of low-pass filter is above the frequency of CLOCK 135 (e.g., 5 times the frequency of CLOCK 135) but below the frequency of the noise to be attenuated (e.g., 10 times less than the noise frequency). In an example in which CLOCK has a frequency of 25 MHz and the noise is 1.4 GHz, the 3 dB point of filter 320 may be in the range of 125-140 MHz.

Figure 5:
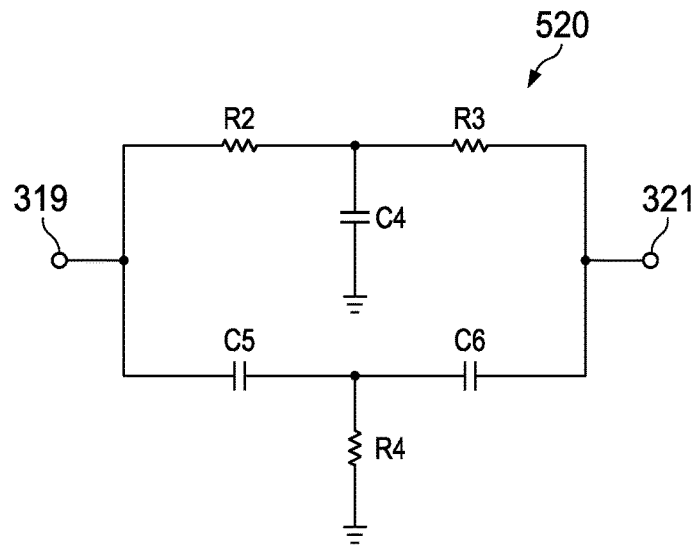
FIG. 5 shows an example of the implementation of the filter of FIG. 3 as a notch filter.

FIG. 5 shows an example of a filter 520, which can be used to implement filter 320 of FIG. 3. In this example, filter 520 is a notch filter comprising resistors R2-R4 and capacitors C4-C6. Resistors R2 and R3 are connected in series between input 319 and output 321. Capacitor C4 is connected between the ground and the connection point between R2 and R3. Similarly, capacitors C5 and C6 are connected in series between input 319 and output 320, with resistor R4 connected between ground and the connection point between C5 and C6. Notch filter 520 comprises a twin T-notch filter. The resistance and capacitance values are chosen so that the center frequency of the notch filter is centered at the anticipated noise frequency (e.g., the range of 1-3 GHz).

Figure 6:
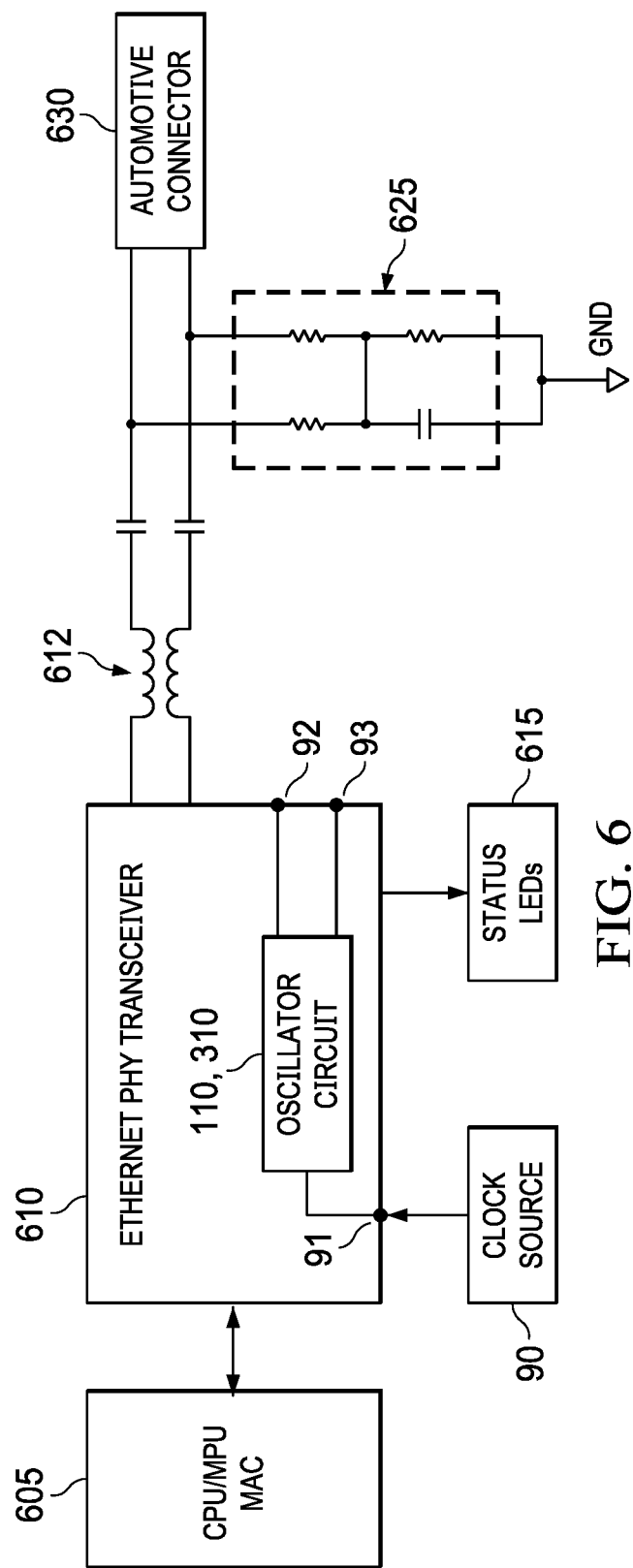
FIG. 6 shows an example of the oscillator circuit as part of an Ethernet transceiver integrated circuit for an automotive application.

FIG. 6 shows an example use-case for the oscillator circuit 110 or 310. The use-case shown is an automotive application in which an Ethernet physical interface (PHY) transceiver IC 610 includes, among other circuits, the oscillator circuit 110/310. The Ethernet PHY transceiver IC 610 is shown coupled to a central processing unit (CPU)/microprocessing unit (MPU) medium access controller (MAC) 605 and to an automotive connector 630 via a common mode choke 612 and termination circuit 625. An external clock source generator 90 is shown coupled to I/O pin 91. One or more status light emitting diodes (LEDs) 615 also are shown coupled to the Ethernet PHY transceiver IC 610 and which indicate the status of the operation of the IC.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. An integrated circuit, comprising:
an inverter having an input and an output;
a first capacitor coupled to a ground;
a transistor having a first transistor terminal, a second transistor terminal, and a control input, the first transistor terminal coupled to the first capacitor and the second transistor terminal coupled to the input of the inverter;
a second capacitor coupled between the output of the inverter and the ground;
a resistor coupled between the output of the inverter and the first transistor terminal;
first and second input/output (I/O) pins configured to be coupled to a crystal, the second I/O pin coupled to the output of the inverter; and
a notch filter coupled between the first I/O pin and the first transistor terminal.

2. The integrated circuit of claim 1, wherein the transistor is a drain-extended metal-oxide-semiconductor field effect transistor.

3. The integrated circuit of claim 1, wherein the transistor is an n-type drain-extended metal-oxide-semiconductor field effect transistor.

4. The integrated circuit of claim 1, wherein:
the first transistor terminal is coupled to an input/output I/O pin configured to be coupled to a clock generator external to the integrated circuit, the clock generator configured to provide an external clock signal having a peak voltage,
the control input to the transistor is configured to receive a bias voltage; and
the peak voltage is larger than the bias voltage.

5. A circuit, comprising:
an inverter having an input and an output;
a buffer having an input coupled to the output of the inverter;
a first capacitor coupled to a ground;
a transistor having a first transistor terminal, a second transistor terminal, and a control input, the first transistor terminal coupled to the first capacitor and the second transistor terminal coupled to the input of the inverter;
a second capacitor coupled between the output of the inverter and the ground;
a resistor coupled between the output of the inverter and the first transistor terminal;
a first input/output (I/O) pin coupled to the first transistor terminal, the first I/O pin configured to be coupled to a clock generator;
a second I/O pin coupled to the output of the inverter;
a third I/O pin coupled to the first transistor terminal, the second and third I/O pins configured to be coupled to a crystal; the crystal coupled to the second and third I/O pins; and
a notch filter coupled between the third I/O pin and the first transistor terminal.

6. The circuit of claim 5, wherein the transistor is a drain-extended metal-oxide-semiconductor field effect transistor.

7. The circuit of claim 5, further including the clock generator coupled to the first I/O pin, the clock generator configured to generate a clock signal having a peak voltage, and wherein the control input to the transistor is configured to receive a bias voltage, and the peak voltage is larger than the bias voltage.

* * * * *